United States Patent [19]
Toshima

[11] Patent Number: 6,146,469
[45] Date of Patent: Nov. 14, 2000

[54] APPARATUS AND METHOD FOR CLEANING SEMICONDUCTOR WAFERS

[75] Inventor: Masato Toshima, Sunnyvale, Calif.

[73] Assignee: Gamma Precision Technology, Santa Cruz, Calif.

[21] Appl. No.: 09/030,644

[22] Filed: Feb. 25, 1998

[51] Int. Cl.[7] .................................. B08B 7/00; B08B 7/04
[52] U.S. Cl. .............................. 134/37; 134/21; 134/34; 134/902
[58] Field of Search .................... 139/30, 2, 34, 139/37; 34/406, 412, 411, 417, 443, 444, 446, 448; 134/902, 10, 11, 21, 31, 35; 438/906

[56] References Cited

U.S. PATENT DOCUMENTS

| | | | |
|---|---|---|---|
| 4,079,522 | 3/1978 | Ham | 34/1 |
| 4,186,032 | 1/1980 | Ham | 134/31 |
| 4,546,726 | 10/1985 | Nagasaka et al. | 118/719 |
| 5,105,556 | 4/1992 | Kurokawa et al. | 34/12 |
| 5,174,855 | 12/1992 | Tanaka | 156/626 |
| 5,248,380 | 9/1993 | Tanaka | 156/626 |
| 5,288,333 | 2/1994 | Tanaka et al. | 134/31 |
| 5,314,846 | 5/1994 | Boitnott | 438/770 |
| 5,735,962 | 4/1998 | Hillman | 134/3 |
| 5,964,952 | 10/1999 | Kunze-Concewitz | 134/2 |

FOREIGN PATENT DOCUMENTS

| | | |
|---|---|---|
| 381435 | 8/1990 | European Pat. Off. |
| 2-185031 | 7/1990 | Japan |

*Primary Examiner*—Alexander Markoff
*Attorney, Agent, or Firm*—Lyon & Lyon LLP

[57] ABSTRACT

The present invention relates to an apparatus and method for cleaning post-etch semiconductor wafers using ultra-pure dry steam.

8 Claims, 6 Drawing Sheets

APPARATUS AND METHOD FOR CLEANING SEMICONDUCTOR WAFERS

FIELD OF THE INVENTION

The field of the present invention relates to semiconductor processing methods and equipment, including, more particularly, equipment and processes for cleaning semiconductor wafers.

TECHNOLOGICAL BACKGROUND

The manufacture of a semiconductor wafer requires many steps, often more than 100. Of these some thirty or more may be related to cleaning the wafer between processing steps. Among the most important of these cleaning steps are those related to post-etch cleaning.

In the process sequence of wafer manufacture, etching typically occurs after masking. One method of masking is through the process of applying a thin film of "photoresist", a light-sensitive polymer, over a previously processed layer on the surface of a wafer and then exposing the photoresist to an intense light through a "mask" which is simply a photographic image of the feature to be created in the etching step. After exposure, the photoresist is "developed", after which the unexposed photoresist may be removed. This is typically followed by a baking step which hardens remaining photoresist. The wafer is then ready for the etching step.

During the etching step, material in layers of the wafer not protected by the hardened photoresist is removed. A goal of certain etching steps is that the etching away of the material be "anisotropic"; i.e., that it occur in one direction, typically orthogonally to the plane of the surface of the wafer. Two known types of etching used in semiconductor manufacturing are chemical etching and physical or "dry" etching. Chemical etching steps are not anisotropic; that is, as the etchings chemical dissolves unprotected material in the layer to be etched orthogonally, it also dissolves material in the layer to be etched from the sidewall of the cavity being created thus creating sidewalls which are not perpendicular. In other words, it erodes away material from underneath the hardened photoresist. Physical etching, a process whereby the material of the layer to be etched is bombarded with high energy ions, is, on the other hand, much more anisotropic and is currently the method of choice for high density wafer manufacture when anisotropic etching is desired.

Physical etching, however, engenders other problems. Because of the extremely high energy of the ions to which the wafer is subjected, undesirable chemical compounds may be formed by reaction of the high energy ions with the metals and other materials of the layers of which the wafer is constructed. The nature of these chemical compounds formed is dependent on the type of ions used to bombard the wafer and on the materials used to construct the particular layers of the device being manufactured. For example, fluorine and chlorine chemistries are common high energy ion sources in modem semiconductor manufacture and the layers of many types of semiconductor wafers typically include materials such as titanium, aluminum, tungsten and silicon. Thus, fluorides or chlorides of titanium, aluminum, tungsten and silicon may be formed during physical etching of wafers containing these elements. Many of the chlorides and fluorides formed are volatile under etching conditions and very quickly move away from the etching area causing no problems. Along with these volatile compounds, however, some non-volatile native metal has also been known to be sputtered into unwanted areas of layers being etched by the high energy ions. Being non-volatile, these sputtered metals tend to adhere to the interior surfaces of the cavity being created during etching.

In addition to the formation of volatile compounds and sputtered native metals during etching, a variety of non-volatile compounds have been known to be formed by reaction of the aforementioned elements with the high-energy ions. These non-volatile compounds, like the native metals, also tend to deposit on and adhere to the interior surfaces of the cavity being created during the etching step. It is desirable to remove these unwanted metal and non-volatile compound residues before the wafer manufacturing process can continue after etching.

By way of example and not limitation, three types of dry etching processes which are subject to residue formation are via etching, pattern etching and small contact hole etching.

Vias are holes etched between metal layers on a wafer to permit creation of an electrical connection between the layers by later filling the via with a conducting material. The unwanted residues within a via can interfere with the creation of the electrical connection thereby adversely affecting the operation of the circuit being created.

Pattern etching is the process of etching channels in a metal layer to form a circuit, which corresponds to the "wiring" of a traditional electrical circuit. Unwanted residues may clog a channel e.g. create a discontinuity in the channel (the equivalent of a "broken wire") or may form a bridge between two or more channels (creating, in essence, a "short circuit").

Small contact hole etching is similar to via etching except that, rather than being formed to provide contact between metal layers, small contact holes provide for physical contact between layers of silicides, a procedure which is typically used in the formation of transistors. During small contact hole etching a layer of photoresist polymer often forms at the bottom of the etched cavity. Since this polymer is typically non-conductive; i.e., it is an insulator, if left in place, it could result in the failure of the packaged device.

In most semiconductor fabrication techniques, once etching is complete, the remaining photoresist is removed by dry ashing, the use of high energy plasmas to, in effect, burn the hardened photoresist from the surface of the wafer. What is left after ashing is an etched wafer which may contain unwanted native metal and non-volatile compound residues within vias, pattern etches and small contact holes as well as mounds of the unwanted residues at the edges of these areas due to the native metal and non-volatile compounds which had adhered to the edges of the photoresist feature during etching.

A common known method for removal of residues from etched surfaces is chemical wet cleaning. However, chemical wet cleaning is fraught with problems. The chemicals used must be of exceptionally high purity and therefore are very expensive. Furthermore, many of the chemicals used are extremely hazardous, both to human health and safety and to the environment. For instance, commonly used wet cleaning procedures employ chemicals such as sulfuric acid, nitric acid, hydrofluoric acid, hydrochloric acid, phosphoric acid, ammonium hydroxide, hydrogen peroxide and a variety of organic solvents. Not only are these chemicals dangerous to workers and to the environment, they pose a monumental disposal problem. In addition, chemical wet cleaning procedures tend to use enormous amounts of water; e.g., in most cases a water wash is necessary between each chemical cleaning step and a very thorough final rinse is required when cleaning has been completed. It has been estimated that a typical semiconductor manufacturer may use as much as six million gallons of water per day, with wafer cleaning procedures accounting for much of the water used.

Another problem with wet cleaning is throughput. That is, wet cleaning is typically a time-consuming multi-step process involving several chemical cleaning and water rinsing cycles. For example, the wet-cleaning procedure known as RCA cleaning can involve ten or more steps, uses sulfuric acid, hydrogen peroxide and ammonium hydroxide and can take an hour or more to complete a full cleaning cycle. The wafer drying step, after cleaning and rinsing are done, can alone consume 10–15 minutes.

A particularly troublesome problem arises during wet cleaning of vias when the water used to rinse the wafer is hot. The problem also occurs when a hot water dip is used as the sole method of removing residues, an approach which can be used when the residues are water-soluble. The problem is Boehmite, aluminum oxide, formation. Dipping a wafer into 100° C. water for one to two seconds is enough time to create enough Boehmite to form to completely fill a via. Since Boehmite is non-conductive; that is, is an insulator, this can result in failure of the semiconductor device. In addition to Boehmite formation, the use of hot water dips necessitates a wafer drying step which, as previously noted, can be a very time-consuming step.

Finally, as semiconductors become more densely packed with circuitry and the channels and holes etched become more minute, a cleaning procedure must be capable of removing smaller and smaller residue particles. The removal of residue particles less than 0.1 micron in size is becoming routinely desirable. However, it has been suggested that wet cleaning processes may reach their limit of utility at particles of about 0.2 micron in size.

While a few dry cleaning processes are known, they also are not without problems. For instance, as noted previously, during small contact hole etching, a polymeric insulating layer often forms on the surface of the silicide at the bottom of the etched cavity. This polymer is non-volatile and quite refractory and requires substantial energy to remove. A dry cleaning process presently used to remove this polymer residue consists of sputtering the oxide off the silicide with energized argon ions. However, when the contact hole is less than 0.25 microns in diameter, which is becoming very common, this method is ineffective due to the limited angle of incidence of the ion beam which can be achieved.

Furthermore, existing dry cleaning processes generally involve the use of relatively reactive species. For instance, the use of reactive gaseous radicals formed from process gases such as $ClF_3$ and HF has been proposed. In another procedure, laser light and propelled gases such as nitrogen and argon are used to remove sputtered residues. These methods and materials are sufficiently high in energy and reactivity to themselves attack the sidewalls and metal layers of etched surfaces thus damaging the wafer while cleaning it.

In contrast, the apparatus and method of the present invention provide for the safe, rapid, efficient, economical and relatively low energy dry cleaning of residues from post-etch wafers.

SUMMARY OF THE INVENTION

The present invention comprises an apparatus and method for cleaning post-etch residues from semiconductor wafers using a vaporized liquid. A liquid is preferably placed in a chamber. Preferably this chamber is separated from a process chamber which contains a wafer to be cleaned. Preferably the process of cleaning comprises heating the liquid to a selected temperature. At some point in the process, the pressure in the process chamber is reduced to a selected pressure. The temperature of the liquid and the pressure in the process chamber are such that, at the selected pressure and temperature, the liquid will exist in a vaporized state.

When communication between the liquid and the process chamber is established, the pressure of the liquid equalizes in response to the pressure in the process chamber and the liquid converts to the vaporized state. In a presently preferred embodiment of this invention, the pressure induced in the process chamber is selected such that, when the pressure in the process chamber and the liquid equilibrate, the residual pressure is still lower than that required to merely maintain the liquid in the vapor state. That is, the vapor formed is superheated; i.e., it contains more thermal energy than necessary to maintain the vaporized state at the selected pressure. The super-heated vapor contains essentially no liquid; it is "dry".

During the volatilization of the liquid, it is possible that some liquid droplets might be entrained in the released vapor so that the vapor is not "dry"; thus, in one aspect of this invention, the apparatus contains baffles to intercept and remove such entrained liquid droplets.

The dry vapor is preferably drawn by the pressure differential between the chamber holding the liquid and the process chamber into the process chamber where it impacts the surface of the wafer and, it is believed that, through a combination of thermal and kinetic energy, removes unwanted residues from the wafer. The pressure in the process chamber is preferably maintained low enough during the actual cleaning to ensure that the if it should cool, remains dry. That is, the vapor does not condense back into liquid.

Once the actual cleaning is complete, communication between the chambers is terminated. The remaining vapor and residue is evacuated from the process chamber. When the remaining vapor and residue have been removed from the process chamber, the pressure in the process chamber is raised to atmospheric, the process chamber is opened and the clean, dry wafer is removed.

In another aspect of this invention, the wafer h older is a chuck, which is connected to a driver such that the chuck (and the affixed wafer) can be made to spin during the cleaning In a further aspect of this invention, a liquid supply reservoir is connected to a liquid chamber by a liquid supply line. The liquid supply line contains a valve which, when closed, isolates the liquid supply reservoir from the liquid chamber.

It is yet another aspect of this invention to include a pressure sensor and a temperature sensor within a liquid chamber to monitor the heating of the liquid and the concomitant increase in pressure in the liquid chamber.

In a further aspect of this invention, the pressure in the process chamber and, when communication is established between the process chamber and the liquid chamber, the pressure in both chambers, is reduced to and maintained at less than atmospheric by means of an evactor.

To more effectively remove vaporized liquid from the process chamber and to permit an evactor to operate at optimal efficiency, as well as to protect the evactor from vaporized liquid and/or liquid itself, a cold trap located between the process chamber and the evactor comprises yet another aspect of this invention.

It is a still further aspect of this invention that all parts of the apparatus, which come in contact with the liquid or the vapor prior to and during contact of the vapor with the wafer to be cleaned, are constructed of non-contaminating material. Thus, the liquid supply reservoir, the tubes and valve connecting the liquid supply reservoir to the liquid chamber, the liquid chamber itself, the connector tubes and the valve connecting the liquid chamber to the process chamber, the temperature and pressure sensors within the liquid chamber, the wafer holder and the walls of the process chamber are all constructed of non-contaminating material in a presently preferred embodiment of this invention.

It is a further aspect of this invention that vapor enters the process chamber through a nozzle which is located within the process chamber, is connected to the end of the tube through which vapor enters the process chamber and is capable of dispersing the vapor over the surface of the wafer to be cleaned. In a presently preferred embodiment of this invention, the nozzle is constructed of a non-contaminating material.

In another preferred embodiment of this invention, the liquid is ultra-pure water and the vapor is ultra-pure dry steam.

BRIEF DESCRIPTION OF THE DRAWINGS

The present invention is illustrated herein by way of example and not limitation.

DETAILED DESCRIPTION OF THE INVENTION

Figure 1:
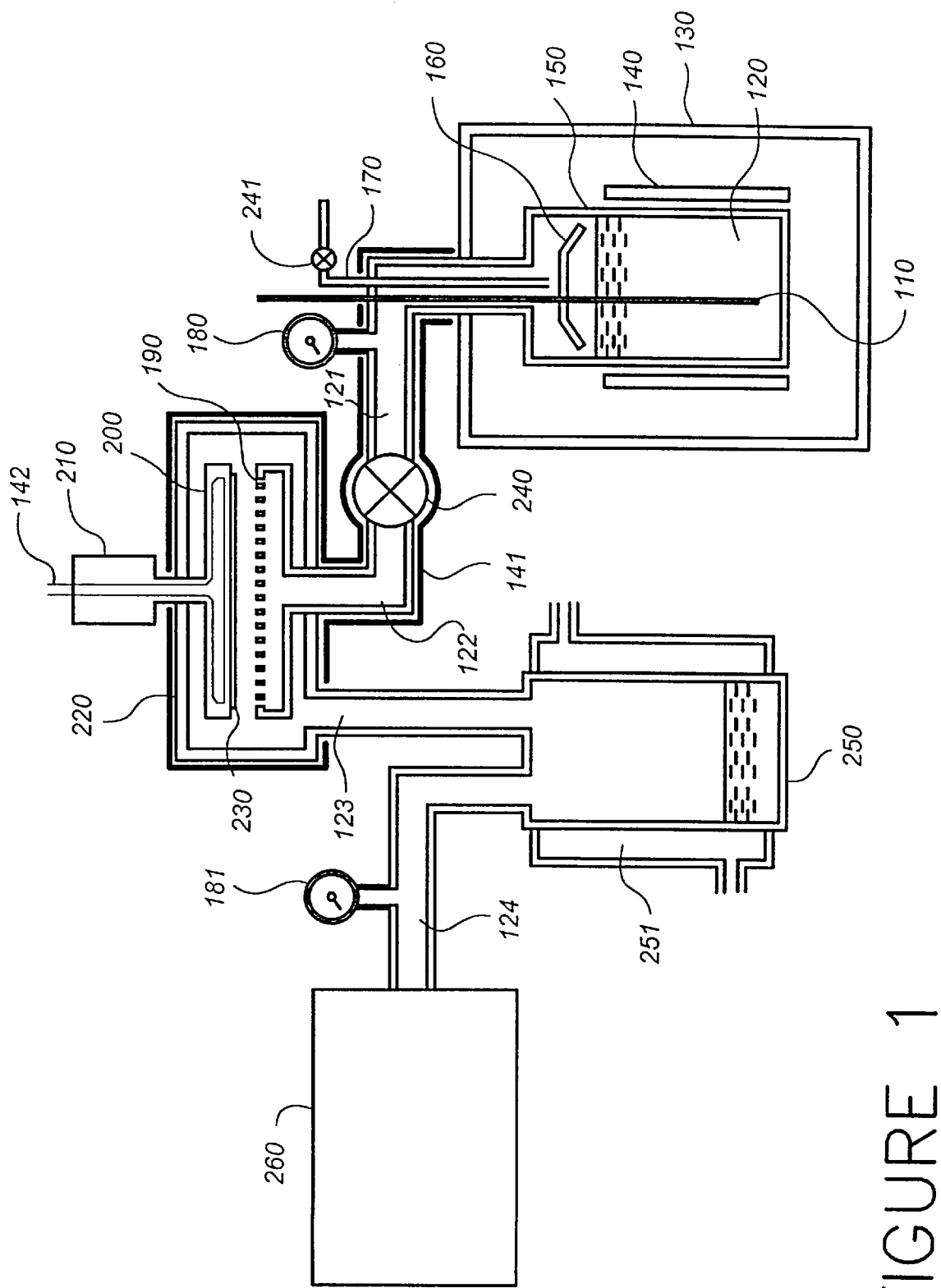
FIG. 1 illustrates an ultra-pure dry steam wafer cleaning apparatus of this invention.
Figure 2:
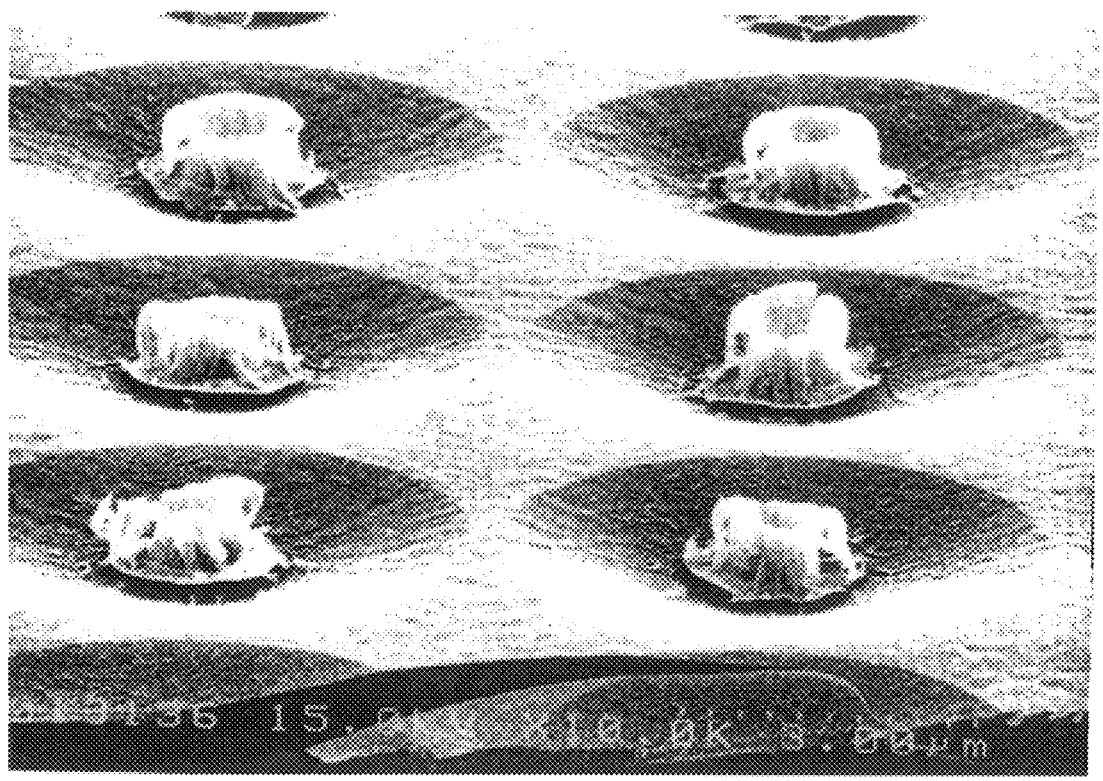
FIG. 2 is a scanning electron photomicrograph of vias showing sputtered residues at the around the entrance to the vias resulting from a dry etching process.
Figure 3:
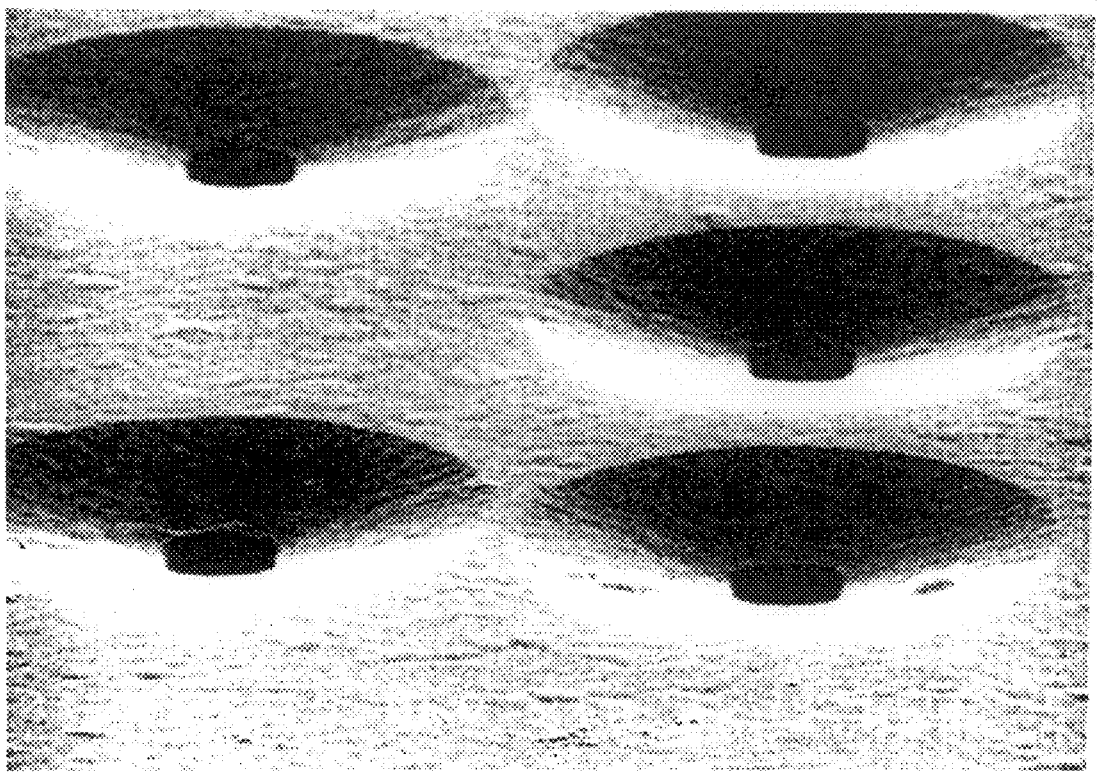
FIG. 3 is a scanning electron photomicrograph of vias showing removal of residues using the method of this invention.
Figure 4:
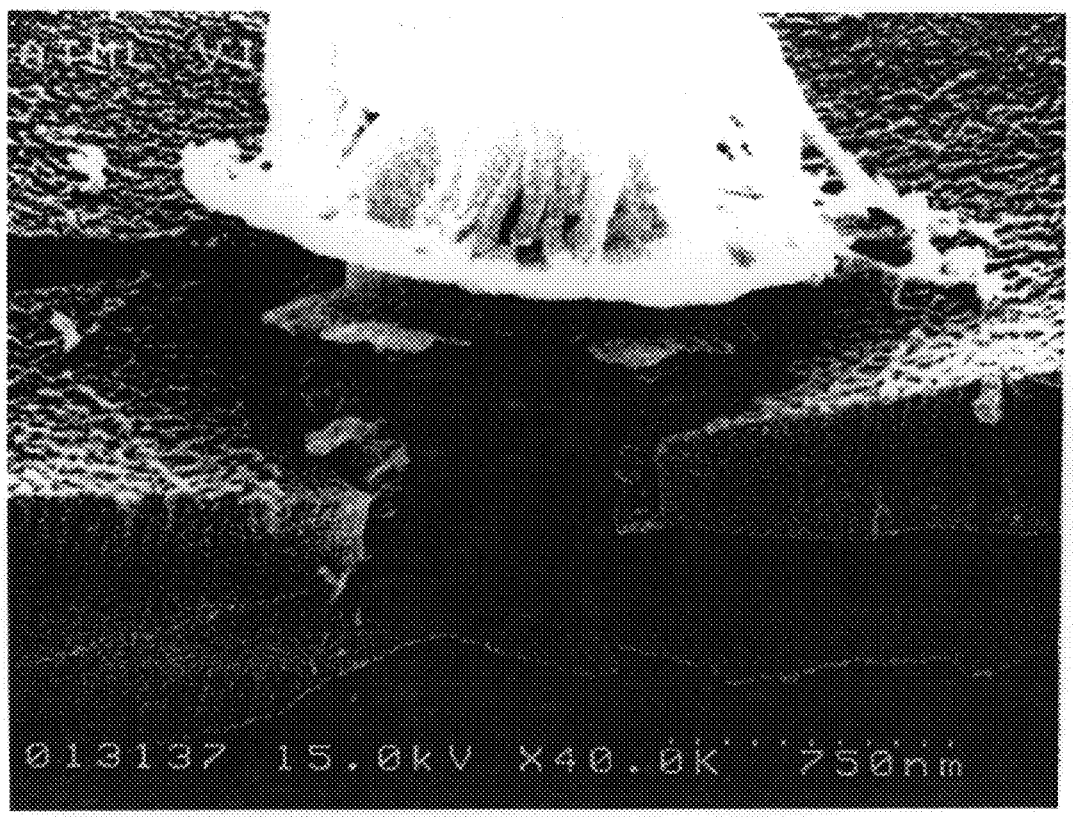
FIG. 4 is a scanning electron photomicrograph of a cross-section through a via before cleaning using the method of this invention.
Figure 5:
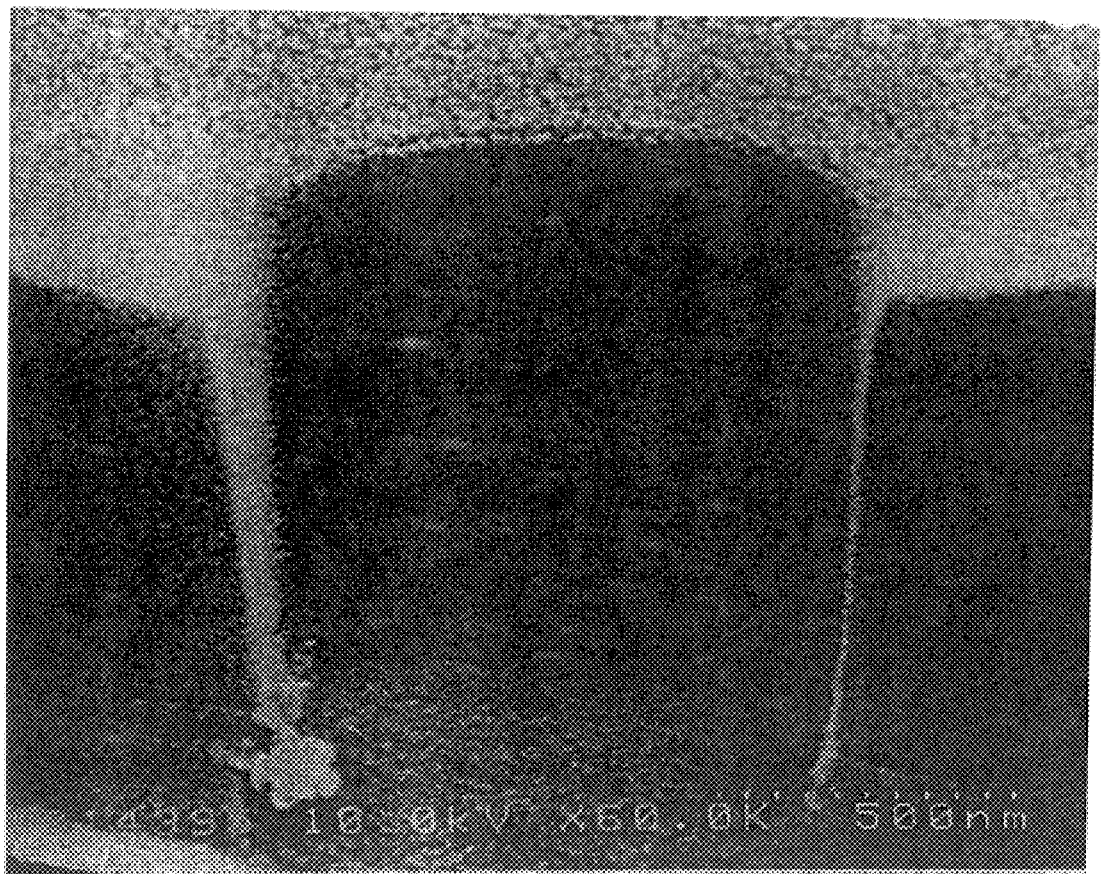
FIG. 5 is a scanning electron photomicrograph of a cross section through a via after cleaning using the method of this invention.
Figure 6:
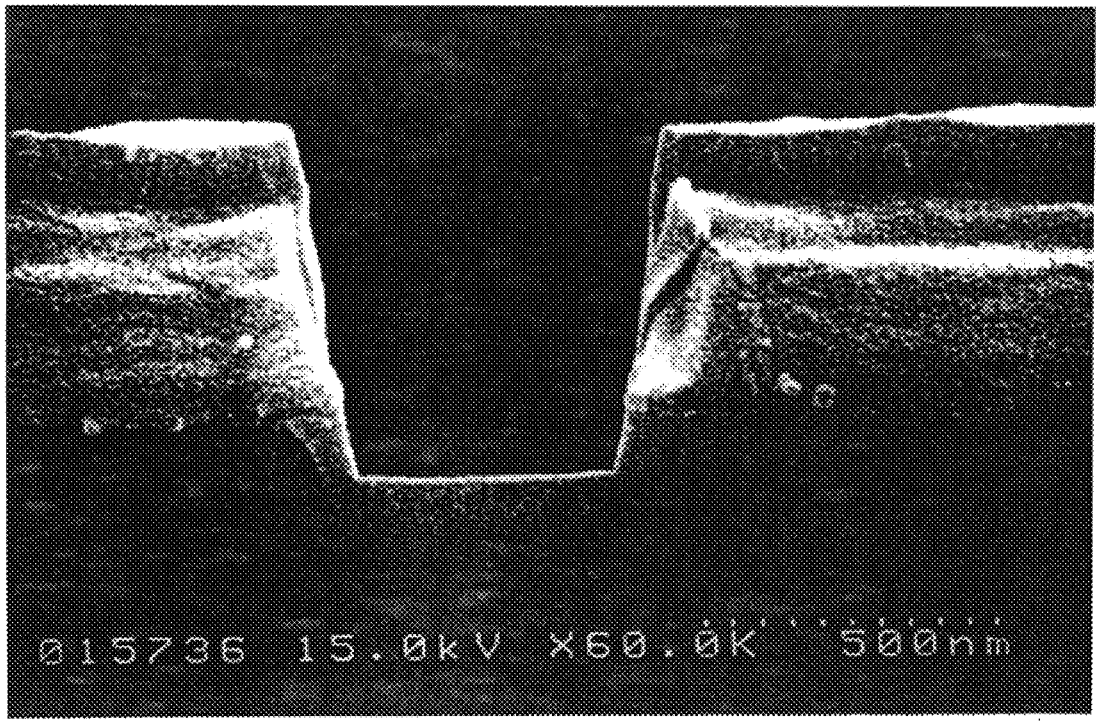
FIG. 6 is a scanning electron photomicrograph of a cross section of an aluminum pattern which has been cleaned in an apparatus and using the method of this invention. The photomicrograph shows that no Boehmite is formed using an apparatus and method as set forth in the present invention.

An apparatus and method for cleaning a post-etch semiconductor wafer using ultra-pure dry steam is described herein. A post-etch wafer 230 is affixed to wafer holder 200 and placed in process chamber 220. Post-etch wafer 230 is a semiconductor wafer which has undergone etching and from which residual photoresist has been removed. It will be appreciated that, depending on the particular semiconductor being produced, post-etch wafer 230 may have undergone several cycles of etching and, therefore, residue formation. The apparatus and method of this invention will safely and effectively remove post-etch residues left after etching at any stage of semiconductor manufacture.

In a presently preferred embodiment of this invention, wafer holder 200 is a mechanical chuck which affixes post-etch wafer 230 in place by means of pressure pads, restraining fingers or the like. Post etch wafer 230 is affixed to wafer holder 200 such that it will remain in contact with wafer holder 200 throughout the cleaning process. When the pressure pads or fingers move away from wafer 230, it can be removed from wafer holder 200.

With valves 240 and 241 open, evactor 260 is turned on and ultra-pure water 120 is drawn from a water reservoir, not shown, through water supply tube 170 into water chamber 150. Valve 240 is capable of regulating the flow of fluids and gases between water chamber 150 and process chamber 220; valve 241 is capable of regulating the flow of fluids and gases between water chamber 150 and the water reservoir, not shown. In a presently preferred embodiment of this invention, valve 240 is a poppet valve.

Evactor 260 is capable of creating and maintaining pressures of less than atmospheric in process chamber 220 and, when valve 240 is open, in both process chamber 220 and water chamber 150. In a presently preferred embodiment of this invention, evactor 260 is a Roots blower.

Water chamber 150 is capable of holding water, accommodating temperatures of from about room temperature to about 180° C. and withstanding pressures of up to about 200 psi. The water reservoir, not shown, water supply tube 170 and water chamber 150 are made of non-contaminating material. Examples, without limitation, of non-contaminating materials which are useful with the present invention are quartz, fluorocarbon polymers such as Teflon® or polyvinylidene fluoride and fluorocarbon-coated materials such as fluorocarbon-coated metal and the like. In a presently preferred embodiment of this invention, the water chamber comprises a quartz container, the water reservoir comprises a fluorocarbon polymer coated metal container and the water supply line comprises a fluorocarbon polymer.

Ultra-pure water 120 contains extremely minute amounts of ionic materials. A typical measure of the "ultra-purity" of water is its resistivity; that is, the less ionic material water contains the less capable it is of conducting electricity. In a presently preferred embodiment of this invention, ultra-pure water 120 has a resistivity of from about 10 MΩ (megaohms) to about 16 MΩ.

When the desired amount of ultra-pure water 120 has been drawn into water chamber 150, valve 240 and valve 241 are closed. Evactor 260 begins the process of reducing the pressure in process chamber 220 to less than atmospheric. A water temperature is selected by the operator depending on the thermal and kinetic energy that the operator wishes to instill in the generated steam. The selected temperature can be between about 25° C. and about 150° C.; more preferably between about 70° C. and about 125° or, in a presently preferred embodiment of this invention, between about 95° C. and about 105° C. The temperature of ultra-pure water 120 in water chamber 150 is measured by temperature sensor 110 which is coupled to water chamber 150. Temperature sensor 110 may directly display the temperatures measured or it may be connected to a separate temperature display monitor. In a presently preferred embodiment of this invention, temperature sensor 110 comprises a thermocouple which is capable of sensing changes in temperature and then directly or indirectly controlling heater 140 to maintain the selected temperature.

Heater 140, which heats water chamber 150; heater 141, which heats connector tubes 121 and 122, valve 240 and process chamber 220; and heater 142 which heats wafer holder 200 are turned on and set to the same pre-selected temperature. Each of heaters 140, 141 and 142 is capable of producing and maintaining temperatures of from about room temperature to about 180° C. Heaters 140, 141 and 142 may be of the same type or different. In a presently preferred embodiment of this invention, heaters 140, 141 and 142 are of the same type, each comprising a silicon rubber heater such as a Kepton® heater (available from Dupont High Performance Films, Circleville, Ohio).

Cold trap 250 is cooled to a temperature of from about +20° C. to about −78° C.; more preferably from about +20 to about −10° C. or, in the presently preferred embodiment of this invention from about +10° C. to about +5° C. In a presently preferred embodiment of this invention, cold trap 250 comprises a double-walled vessel through which a refrigerated liquid such as, without limitation, refrigerated ethylene glycol can be circulated in the space between the walls.

The appropriate reduced pressure to be produced in process chamber 220 by evactor 260 is selected by determining the pressure at which ultra-pure water 120 at the pre-selected temperature will exist in the gaseous state. The pressure in process chamber 220 is measured by pressure sensor 181. Pressure sensor 181 may directly display the pressure measured in process chamber 220 or it may be connected to a separate display monitor. In a presently preferred embodiment of this invention, pressure sensor 181 is a semiconductor pressure transducer. Pressure sensor 180, which measures the pressure in water chamber 150 resulting from the heating of ultra-pure water 120 is, in a preferred embodiment of this invention, also a semiconductor pressure transducer. Pressure sensor 180 may either directly display the pressure in water chamber 150 or it may be connected to a separate display monitor.

The determination of the appropriate pressure to be established and maintained in the apparatus during processing is readily made by reference to published tables and charts of pressure/temperature relationships from which can be directly read what pressure must be attained to convert and maintain ultra-pure water 120 in the gaseous state. The pressure in process chamber 220 is preferably reduced to less than that calculated to just maintain ultra-pure water 120 in the gaseous state; that is, when valve 240 is opened, the equilibrated pressure in process chamber 220 and water chamber 150 will be such that the steam produced will be super-heated, it will contain more thermal energy than necessary to merely maintain the gaseous state. In a presently preferred embodiment of this invention, the pressure in process chamber 220, before valve 240 is opened, as indicated by pressure sensor 181, is adjusted to from about 5 to about 10 Torr less than that calculated to just convert ultra-pure water 120 to steam at the pre-selected temperature.

Wafer holder 200, with wafer 230 affixed to it is made to rotate by driver 210. In a presently preferred embodiment of this invention, driver 210, which is capable of causing wafer holder 200 to rotate about an axis perpendicular to the plane of wafer 230 affixed to wafer holder 200, is a direct drive electric motor.

Valve 240 is opened. Ultra-pure water 120 in water chamber 150 converts to ultra-pure steam. The steam passes around baffle 160, which traps any entrained water droplets. In a presently preferred embodiment of this invention, baffle 160 comprises a solid plate, made of non-contaminating material such as that discussed previously herein, placed above the level of ultra-pure water 120 in water chamber 150 and obstructing the direct path of steam formed from ultra-pure water 120 to connector tube 121 connecting water chamber 150 to valve 240.

The dry steam then proceeds through connector tube 121, valve 240, connector tube 122 and steam nozzle 190 and impinges on spinning post-etch wafer 230. In a presently preferred embodiment of this invention, steam nozzle 190 comprises a flattened tube constructed of a non-contaminating material such as that discussed previously herein, sealed at one end and connected at the other end to connector tube 122 through which steam enters process chamber 220. Steam nozzle 190 is slightly longer than the diameter of post-etch wafer 230 and is perforated along its length on the flattened side facing post-etch wafer 230.

After from about 5 to about 30 seconds, more preferably from about 5 to about 20 seconds or, in the presently preferred embodiment of this invention, from about 5 to about 10 seconds, valve 240 is closed. Evactor 260 remains on to draw steam and removed residue particles from process chamber 220. After about 10 to about 60, more preferably from about 15 to about 30 or, in the presently preferred embodiment of this invention, from about 20 to about 30 seconds have elapsed, evactor 260 is turned off and the pressure in process chamber 220 is returned to atmospheric. Process chamber 220 is opened and clean, dry post-etch wafer 230 is removed from the apparatus.

CONCLUSION

An apparatus and method have been described herein for the cleaning of residues from post-etch semiconductor wafers using ultra-pure dry steam. Although certain embodiments and examples have been used to describe the present invention, it will be apparent to those skilled in the art that changes to the embodiments and examples may be made without departing from the scope and spirit of this invention.

Other embodiments of this invention are contained within the following claims.

What is claimed:

1. A method for cleaning a post-etch semiconductor wafer, comprising:

heating ultra-pure water to a pre-selected temperature in a water chamber which is coupled to a process chamber but is isolated from said process chamber by a closed valve;

affixing said post-etch semiconductor wafer to be cleaned to a wafer holder located within said process chamber;

reducing the pressure in said process chamber to a pressure at or below that calculated to cause ultra-pure water at the pre-selected temperature to convert to ultra-pure dry steam;

opening said valve resulting in said ultra-pure water in said water chamber being converted to ultra-pure dry steam; and, directing said ultra-pure dry steam against said surface to be cleaned of said post-etch semiconductor wafer.

2. The method of claim 1 wherein said pre-selected temperature is from about 30° C. to about 150° C.

3. The method of claim 1 wherein said pre-selected temperature is from about 70° C. to about 125° C.

4. The method of claim 1 wherein said pre-selected temperature is from about 95° C. to about 105° C.

5. The method of claim 1 wherein said pressure in said process chamber is reduced to a pressure of about 5 to 10 Torr less than that calculated to cause water at the pre-selected temperature to convert to steam.

6. The method of claim 1, wherein said ultra-pure dry steam is directed against the surface of the post-etch semiconductor wafer to be cleaned by a steam nozzle.

7. The method of claim 1, wherein said wafer holder is rotatable.

8. The method of claim 7, wherein said wafer holder comprises a mechanical chuck.

* * * * *